United States Patent
Nakano et al.

(10) Patent No.: US 9,343,287 B2
(45) Date of Patent: May 17, 2016

(54) SUBSTRATE PROCESSING APPARATUS INCLUDING SPIN CHUCK

(71) Applicant: DAINIPPON SCREEN MFG. CO., LTD., Kyoto (JP)

(72) Inventors: Akiyoshi Nakano, Kyoto (JP); Kurumi Yagi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/273,689

(22) Filed: May 9, 2014

(65) Prior Publication Data

US 2014/0331927 A1    Nov. 13, 2014

(30) Foreign Application Priority Data

May 13, 2013   (JP) ................................. 2013-101532
Jan. 24, 2014   (JP) ................................. 2014-011684

(51) Int. Cl.
| | | |
|---|---|---|
| B05C 5/02 | (2006.01) | |
| H01L 21/687 | (2006.01) | |
| H01L 21/67 | (2006.01) | |
| H01L 21/00 | (2006.01) | |
| H01L 21/02 | (2006.01) | |

(52) U.S. Cl.
CPC .......... *H01L 21/00* (2013.01); *H01L 21/02052* (2013.01); *H01L 21/67017* (2013.01); *H01L 21/68728* (2013.01); *H01L 21/68735* (2013.01)

(58) Field of Classification Search
None
See application file for complete search history.

(56) References Cited

U.S. PATENT DOCUMENTS

| | | | | |
|---|---|---|---|---|
| 5,040,484 | A * | 8/1991 | Mears et al. .................. | 118/503 |
| 2002/0153676 | A1* | 10/2002 | Noguchi ........................ | 118/503 |
| 2003/0098531 | A1 | 5/2003 | Horie et al. .................... | 266/127 |
| 2005/0098553 | A1* | 5/2005 | Devine et al. ................. | 219/411 |
| 2007/0094885 | A1* | 5/2007 | Walter ............................ | 34/237 |
| 2007/0134431 | A1* | 6/2007 | Hara et al. ..................... | 118/52 |
| 2007/0145231 | A1* | 6/2007 | Chen et al. .................... | 248/689 |
| 2012/0090649 | A1* | 4/2012 | Takahashi et al. ............. | 134/33 |
| 2014/0030048 | A1* | 1/2014 | Kosuge et al. ........... | 414/225.01 |
| 2014/0261162 | A1* | 9/2014 | Yamaguchi .................... | 118/52 |

FOREIGN PATENT DOCUMENTS

JP     2003-092343     3/2003

* cited by examiner

*Primary Examiner* — Binu Thomas
(74) *Attorney, Agent, or Firm* — Ostrolenk Faber LLP

(57) ABSTRACT

A substrate processing apparatus includes a plurality of chuck pins and a heat source. The chuck pin includes a conductive member made of a material containing carbon, and a pin cover that covers the conductive member. The conductive member includes a gripping portion softer than the substrate, the gripping portion to be pressed onto a peripheral edge portion of the substrate, and protrudes outward from an outer peripheral edge of the substrate in a plan view in a state where the gripping portion is pressed onto the peripheral edge portion of the substrate. The pin cover covers, in a plan view, the entire region of a part of the conductive member protruding outward from the outer peripheral edge of the substrate in a plan view in a state where the gripping portion is pressed onto the peripheral edge portion of the substrate.

11 Claims, 7 Drawing Sheets

SUBSTRATE PROCESSING APPARATUS INCLUDING SPIN CHUCK

BACKGROUND OF THE INVENTION

1. Field of the Invention

The present invention relates to a substrate processing apparatus for processing a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

In a manufacturing process for a semiconductor device or a liquid crystal display device, etc., a substrate processing apparatus is used to process substrates, such as semiconductor wafers, glass substrates for liquid crystal display devices, etc.

A single substrate processing type substrate processing apparatus described in Japanese Patent Application Publication No. 2003-092343 includes a spin chuck that holds and rotates a substrate horizontally, and a nozzle that discharges a processing liquid toward the substrate held by the spin chuck. The spin chuck includes a plurality of chuck pins disposed around the substrate. The spin chuck presses the plurality of chuck pins onto a peripheral edge portion of the substrate to hold the substrate in a horizontal posture. The chuck pins are made of a conductive material containing carbon.

SUMMARY OF THE INVENTION

The present inventor conducted an examination in order to facilitate processing of the substrate by causing a heat source to generate heat above the substrate when an upper surface of the substrate is covered by the processing liquid or when the substrate to which the processing liquid is supplied is dried.

However, the chuck pins are disposed in the periphery of the substrate. Thus, when the heat source generates heat, not only the substrate and the processing liquid but also the chuck pins are heated at the same time. Therefore, the temperature of the chuck pins may exceed the softening temperature and thereby the chuck pins may be deformed.

As described in Japanese Patent Application Publication No. 2003-092343, conventional chuck pins are made of a material having conductivity for preventing electrification of the substrate. Such a material generally contains carbon. Therefore, outer surfaces of the chuck pins having conductivity are often black.

Black easily absorbs light. Thus, in a case where the heat source is a lamp, an increase in the temperature of the chuck pins may be accelerated and the chuck pins are deformed in a short time. It is conceivable that the chuck pins are made of a non-black conductive material such as ceramics. However, when the chuck pins are harder than the substrate, the substrate may be damaged.

Therefore, one of the objects of the present invention is to provide a substrate processing apparatus capable of preventing deformation of chuck pins due to heating and preventing the chuck pins from damaging a substrate.

A preferred embodiment of the present invention provides a substrate processing apparatus including a spin chuck including a plurality of chuck pins disposed around a substrate, chuck opening/closing mechanisms that press the plurality of chuck pins onto a peripheral edge portion of the substrate to cause the plurality of chuck pins to grip the substrate in a horizontal posture, and a spin motor that rotates the substrate gripped by the plurality of chuck pins, a processing liquid supply device that supplies a processing liquid to the substrate held by the spin chuck, and a heat source disposed above the substrate which is held by the spin chuck, wherein each of the plurality of chuck pins includes a conductive member including a gripping portion that is softer than the substrate, the gripping portion to be pressed onto the peripheral edge portion of the substrate, the conductive member being made of a material containing carbon, the conductive member protruding outward from an outer peripheral edge of the substrate in a plan view in a state where the gripping portion is pressed onto the peripheral edge portion of the substrate, and a pin cover that covers, in a plan view, the entire region of a part (protruding portion) of the conductive member protruding outward from the outer peripheral edge of the substrate in a plan view in a state where the gripping portion is pressed onto the peripheral edge portion of the substrate.

With this arrangement, the plurality of chuck pins is pressed onto the peripheral edge portion of the substrate by the chuck opening/closing mechanisms. Thereby, the substrate is gripped by the plurality of chuck pins in a horizontal posture. The spin motor rotates the substrate in a state where the plurality of chuck pins grips the substrate. The processing liquid supply device supplies the processing liquid to the substrate gripped by the plurality of chuck pins. The heat source generates heat above the substrate gripped by the plurality of chuck pins. Thereby, at least one of the substrate and the processing liquid on the substrate is heated by the heat source.

Each of the plurality of chuck pins includes the conductive member having conductivity and the pin cover that covers the conductive member. The conductive member is made of the material containing carbon and has conductivity. The conductive member includes the gripping portion to be pressed onto the peripheral edge portion of the substrate. Therefore, the part in contact with the substrate during rotation of the substrate (gripping portion) has conductivity. Thus, electrification of the substrate due to the rotation of the substrate, electrification of the substrate due to supply of the electrically-charged processing liquid, and the like can be suppressed or prevented. Furthermore, since the gripping portion of the conductive member is softer than the substrate, damage to the substrate due to contact between the substrate and the conductive member can be suppressed or prevented.

In a state where the plurality of gripping portions is pressed onto the peripheral edge portion of the substrate, a part of the conductive member is disposed in the periphery of the substrate in a plan view of the spin chuck. The pin cover covers, in a plan view, the entire region of the protruding portion (part of the conductive member) protruding outward from the outer peripheral edge of the substrate in a plan view in a state where the plurality of gripping portions is pressed onto the peripheral edge portion of the substrate. Therefore, a part of the conductive member is protected from the heat source by the pin cover. Even when the other part of the conductive member placed below the substrate is exposed from the pin cover in a plan view, this part is protected from the heat source by the substrate. Therefore, the entire conductive member is protected from the heat source. Thereby, deformation of the chuck pin due to heating can be prevented.

In the preferred embodiment of the present invention, the heat source may include a lamp that emits light (electromagnetic wave containing at least one of a visible ray and a near infrared ray) toward the substrate gripped by the spin chuck from the upper side of the substrate. The pin cover may have higher reflectivity of the light than that of the conductive member.

With this arrangement, the lamp is disposed above the substrate gripped by the spin chuck. The lamp emits the light toward the substrate. Thereby, the light is irradiated to the substrate, and at least one of the substrate and the processing liquid on the substrate is heated. The pin cover that covers the conductive member has higher reflectivity of the light than that of the conductive member. In other words, the pin cover has lower absorptivity of the light than that of the conductive member. Therefore, the pin cover is less likely to be heated than the conductive member, and the temperature thereof is less likely to be increased than that of the conductive member. Thus, the pin cover can not only protect the conductive member from the light of the lamp but also suppress an increase in the temperature of the pin cover itself. Thereby, an increase in the temperature of the chuck pin can be suppressed.

In the preferred embodiment of the present invention, the pin cover may include a white (including pure white and milky white) outer surface. The entire outer surface of the pin cover may be white or a partial region of the outer surface may be white. That is, it is sufficient that a region of the outer surface of the pin cover which is visible in a plan view is white.

With this arrangement, the pin cover has the white outer surface that easily reflects the light. Meanwhile, the conductive member is made of the material containing black carbon, and has a black outer surface. Therefore, the pin cover has higher reflectivity of the light than that of the conductive member. Further, since the outer surface of the pin cover is white that easily reflects the light, an amount of the light to be absorbed by the pin cover can be reduced, so that the increase in the temperature of the pin cover itself can be efficiently suppressed.

In the preferred embodiment of the present invention, the chuck opening/closing mechanisms may move the plurality of chuck pins between a close position where the gripping portions are pressed onto the peripheral edge portion of the substrate and an open position where the gripping portions are separated from the peripheral edge portion of the substrate. Each of the pin covers may include a support portion that extends obliquely downward from the gripping portion and supports a lower surface peripheral edge portion of the substrate in a state where the gripping portion is separated from the peripheral edge portion of the substrate. Further, the pin cover may be softer than the substrate.

With this arrangement, the chuck opening/closing mechanisms move the plurality of chuck pins between the close position and the open position. Thereby, the gripping portions are moved between the position where the gripping portions are pressed onto the peripheral edge portion of the substrate and the position where the gripping portions are separated from the peripheral edge portion of the substrate. The pin cover includes the support portion that supports the lower surface peripheral edge portion of the substrate in a state where the gripping portion is separated from the peripheral edge portion of the substrate, that is, in a state where the chuck pin is placed at the open position.

The support portion extends obliquely downward from the gripping portion. Therefore, when the chuck pin is moved from the open position to the close position, the gripping portion is brought close to the peripheral edge portion of the substrate, and the support portion moves the substrate upward. Thereby, the gripping portion is pressed onto the peripheral edge portion of the substrate, so that the substrate is gripped by the plurality of gripping portions. When the chuck pin is moved from the close position to the open position, the gripping portion is separated from the peripheral edge portion of the substrate while the support portion moves the substrate downward. Thereby, in a state where all the gripping portions are separated from the peripheral edge portion of the substrate, the substrate is supported by the plurality of support portions.

Since the support portion that supports the lower surface peripheral edge portion of the substrate is provided in the pin cover, the conductive member is downsized more than in a case where the support portion is provided in the conductive member. Therefore, the part to be protected from the heat source (part of the conductive member) can be reduced. Further, since the support portion that rubs against a lower surface of the substrate is softer than the substrate, damage to the substrate due to contact between the substrate and the pin cover can be suppressed or prevented. Thereby, the quality of the substrate processed by the substrate processing apparatus can be further enhanced.

In the preferred embodiment of the present invention, the pin cover may be a different member from the conductive member.

With this arrangement, the conductive member and the pin cover are different members to be combined with each other. Since the pin cover is a different member from the conductive member, the member to be combined with the conductive member, the shape of the pin cover is more highly freely changed than in a case where the pin cover is a coating layer adhering to an outer surface of the conductive member. Therefore, the thickness of the pin cover is easily increased. Thus, heat transmitted from the heat source to the conductive member can be further reduced by the pin cover. Thereby, an increase in the temperature of the conductive member can be further suppressed.

In the preferred embodiment of the present invention, the pin cover may include a pin covering portion that accommodates the gripping portion to cover at least an upper surface of the gripping portion in a plain view. The pin cover may define an inward opening that extends inward from the gripping portion to an outside of the pin covering portion.

With this arrangement, the gripping portion provided in the conductive member is accommodated in the pin covering portion provided in the pin cover. At least a part of the pin covering portion is disposed above the gripping portion and covers the upper surface of the gripping portion. Therefore, the pin cover can protect the upper surface of the gripping portion from the heat source. Further, the inward opening that extends inward from the gripping portion to the outside of the pin covering portion is defined by the pin cover. Thus, by causing the peripheral edge portion of the substrate to enter into the inward opening, the gripping portion can be pressed onto the peripheral edge portion of the substrate. Therefore, the pin cover can protect the gripping portion from the heat source without obstructing gripping of the substrate by the gripping portion.

In the preferred embodiment of the present invention, the pin cover may define an outward opening that extends outward from the gripping portion to the outside of the pin covering portion, and continues to a gap between an inner surface of the pin covering portion and an outer surface of the gripping portion.

With this arrangement, the outward opening that extends outward from the gripping portion to the outside of the pin covering portion is defined by the pin cover. As described above, the conductive member and the pin cover are different members to be combined with each other. Thus, a minute gap is generated between the inner surface of the pin covering portion and the outer surface of the gripping portion. When the processing liquid supply device supplies the processing liquid to the substrate, a minute amount of the processing liquid may enter into the gap between the pin covering portion and the gripping portion. The outward opening continues to the gap between the pin covering portion and the gripping portion, and is opened outward. Therefore, the processing liquid entering between the pin covering portion and the gripping portion is moved to the outward opening and discharged outward from the outward opening by rotation of the spin chuck. Thereby, a remaining amount of the processing liquid in the chuck pin can be reduced, so that contamination of the substrate due to the remaining liquid can be reduced.

In the preferred embodiment of the present invention, the outward opening may be longer in the up and down direction than the gripping portion.

With this arrangement, the outward opening is longer in the up and down direction than the gripping portion, and a sufficient opening area is secured in the outward opening. Therefore, the processing liquid entering into the pin cover through the inward opening can be efficiently discharged from the outward opening. Thereby, the remaining amount of the processing liquid in the chuck pin can be reduced, so that the contamination of the substrate due to the remaining liquid can be reduced.

In the preferred embodiment of the present invention, the outward opening may be opened outward and also opened downward.

With this arrangement, the outward opening is opened outward and also opened downward. The processing liquid in the outward opening flows downward in the outward opening by gravitational force. Therefore, in a case where a lower end of the outward opening is closed, the processing liquid is accumulated in the lower end of the outward opening. Meanwhile, in a case where the outward opening is opened downward, the processing liquid flowing down to the lower end of the outward opening is discharged downward from the outward opening. Therefore, the remaining amount of the processing liquid in the chuck pin can be reduced, so that the contamination of the substrate due to the remaining liquid can be reduced.

In the preferred embodiment of the present invention, the pin cover may include a coating layer closely attached to an outer surface of the conductive member. The pin cover may include the coating layer and a different member from the conductive member (cover member), or the entire pin cover may be formed by the coating layer.

With this arrangement, at least a part of the outer surface of the conductive member is coated and covered by the coating layer closely attached to the outer surface of the conductive member. Therefore, the conductive member is protected from the heat source by the coating layer. Thereby, the increase in the temperature of the conductive member can be suppressed. Further, since the thickness of the coating layer is easily decreased, an increase in the weight of the chuck pin can be suppressed. Thereby, an increase in inertial mass of the chuck pin can be suppressed. Therefore, the force applied to the chuck pin by the spin motor at the time of starting the rotation of the substrate can be lowered.

In the preferred embodiment of the present invention, the substrate processing apparatus may include a control device that controls the spin chuck, the processing liquid supply device, and the heat source. In this case, the control device may execute a liquid film forming step of causing the processing liquid supply device to supply the processing liquid to the substrate to form a liquid film of the processing liquid covering the entire upper surface of the substrate, and a heating step of causing the heat source to generate heat in a state where the liquid film of the processing liquid formed in the liquid film forming step is placed on the substrate.

In a case where the substrate processing apparatus includes the control device, the control device may execute a processing liquid supplying step of causing the processing liquid supply device to supply the processing liquid to the substrate while causing the spin chuck to rotate the substrate, a drying step of removing the processing liquid from the substrate by causing the spin chuck to rotate the substrate at a higher rotation speed than the rotation speed in the processing liquid supplying step in a state where supply of the processing liquid to the substrate is stopped, to dry the substrate, and a heating step of causing the heat source to generate heat in parallel with the drying step.

In the preferred embodiment of the present invention, the conductive member may include the gripping portion that is softer than the substrate, the gripping portion to be pressed onto the peripheral edge portion of the substrate, and a holding portion that is harder than the gripping portion and holds the gripping portion.

With this arrangement, the gripping portion and the holding portion are provided in the conductive member. Both the gripping portion and the holding portion have conductivity. Therefore, by contact between the substrate and the gripping portion, the electrification of the substrate can be suppressed or prevented. Further, since the gripping portion in contact with the substrate is softer than the substrate, the damage to the substrate due to the contact between the substrate and the conductive member can be suppressed or prevented. Furthermore, since the holding portion that holds the gripping portion has higher rigidity than that of the gripping portion, the rigidity of the entire conductive member can be enhanced. Thereby, a deformation amount of the chuck pin can be reduced.

The foregoing and other objects, features and advantages of the present invention will become more apparent from the description of preferred embodiments provided below with reference to the accompanying drawings.

DETAILED DESCRIPTION OF THE PREFERRED EMBODIMENTS

Figure 1:
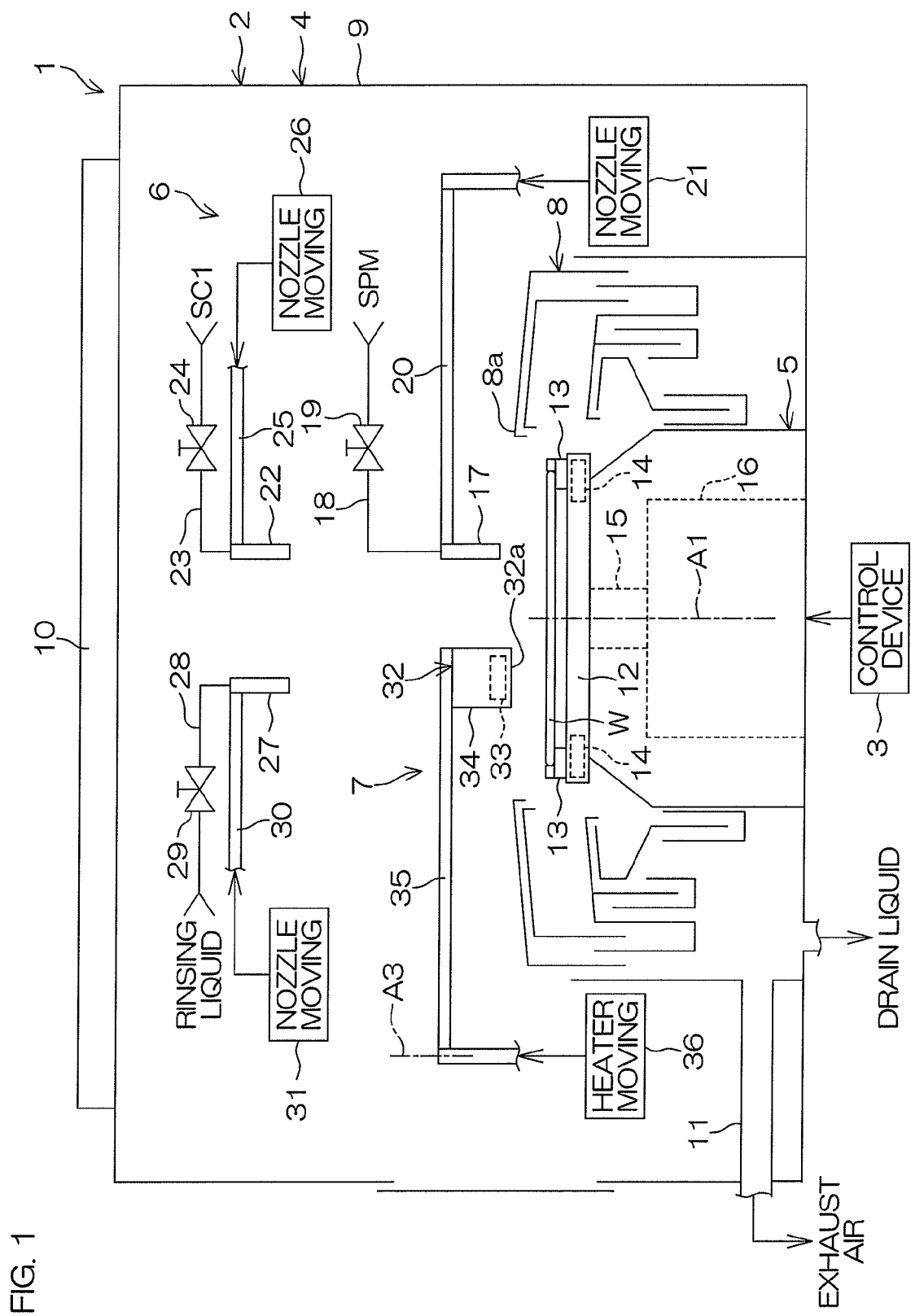
FIG. 1 is a schematic view in which an interior of a chamber provided in a substrate processing apparatus according to a preferred embodiment of the present invention is seen horizontally.
Figure 2:
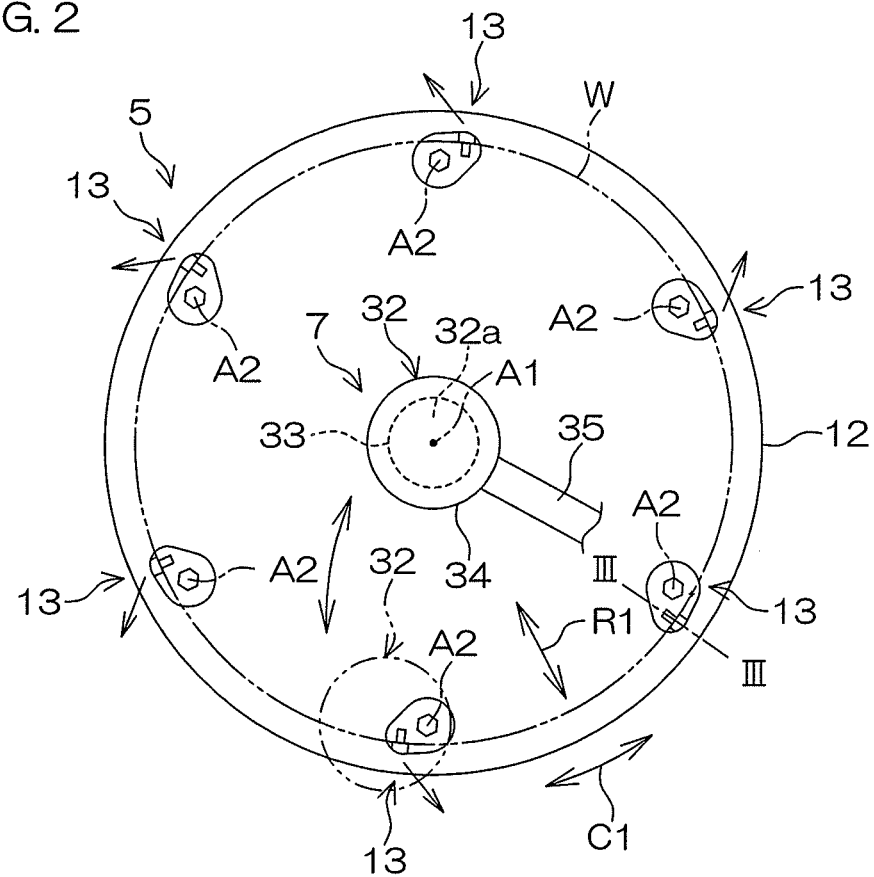
FIG. 2 is a schematic plan view of a spin base and an arrangement related thereto.
Figure 3:
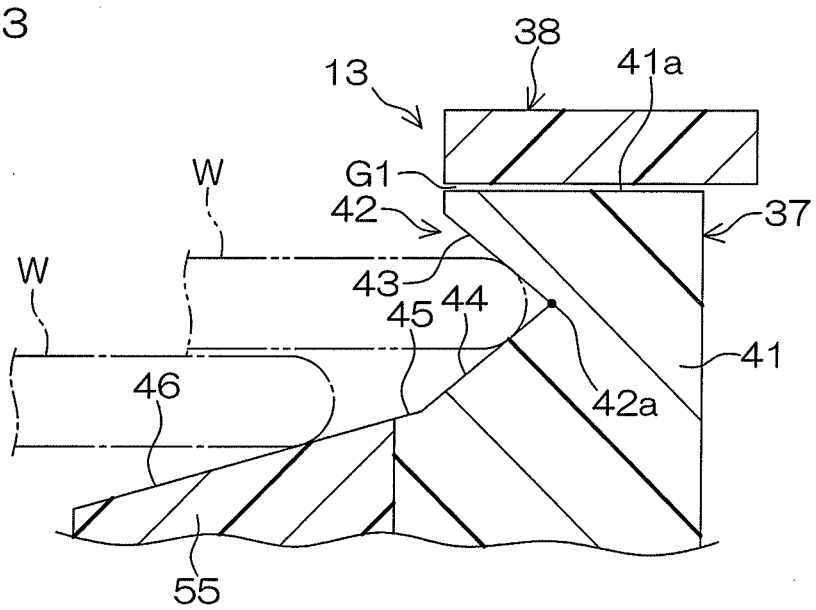
FIG. 3 is a schematic sectional view of a chuck pin taken along line III-III shown in FIG. 2.

FIG. 1 is a schematic view in which an interior of a chamber 4 provided in a substrate processing apparatus 1 according to a preferred embodiment of the present invention is seen horizontally. FIG. 2 is a schematic plan view of a spin base 12 and an arrangement related thereto. FIG. 3 is a schematic sectional view of a chuck pin 13 taken along line III-III shown in FIG. 2. As described below, the chuck pin 13 can be moved between a close position and an open position. Hereinafter, a state where the chuck pin 13 is placed at the close position will be described unless otherwise specified.

As shown in FIG. 1, the substrate processing apparatus 1 is a single substrate processing type apparatus that processes a disc-shaped substrate W such as a semiconductor wafer one by one. The substrate processing apparatus 1 includes a plurality of processing units 2 that supplies a processing liquid to the substrate W, and a control device 3 that controls actions of devices provided in the substrate processing apparatus 1 and opening/closing of valves.

As shown in FIG. 1, each of the processing units 2 is a single substrate processing type unit. Each of the processing units 2 includes the box-shaped chamber 4 having an interior space, a spin chuck 5 that holds one substrate W in a horizontal posture in the chamber 4 and rotates the substrate W about the vertical substrate rotation axis A1 passing through the center of the substrate W, a processing liquid supply device 6 that supplies the processing liquid to the substrate W held by the spin chuck 5, a heating device 7 that heats the substrate W held by the spin chuck 5 from the upper side of the substrate W, and a tubular cup 8 that surrounds the spin chuck 5 about the substrate rotation axis A1.

As shown in FIG. 1, the chamber 4 includes a box-shaped partition wall 9 that accommodates the spin chuck 5 and the like, a FFU 10 (fan filter unit 10) serving as a fan unit that sends the clean air (air filtered by a filter) into the partition wall 9 from an upper portion of the partition wall 9, and an exhaust duct 11 that discharges the gas in the chamber 4 from a lower portion of the cup 8. The FFU 10 is disposed above the partition wall 9. The FFU 10 sends the clean air downward from a ceiling of the partition wall 9 into the chamber 4. The exhaust duct 11 is connected to a bottom portion of the cup 8, and guides the gas in the chamber 4 toward an exhaust processing facility provided in a factory in which the substrate processing apparatus 1 is installed. Therefore, a down flow (downward flow) flowing downward in the chamber 4 is formed by the FFU 10 and the exhaust duct 11. The substrate W is processed in a state where the down flow is formed in the chamber 4.

As shown in FIG. 1, the spin chuck 5 includes the disc-shaped spin base 12 held in a horizontal posture, the plurality of chuck pins 13 protruding upward from an upper surface outer peripheral portion of the spin base 12, and chuck opening/closing mechanisms 14 that open/close the plurality of chuck pins 13. The spin chuck 5 further includes a spin shaft 15 that extends downward along the substrate rotation axis A1 from a center portion of the spin base 12, and a spin motor 16 that rotates the spin shaft 15 to rotate the spin base 12 and the chuck pins 13 about the substrate rotation axis A1.

As shown in FIG. 2, the outer diameter of the spin base 12 is larger than the diameter of the substrate W. The center line of the spin base 12 is disposed on the substrate rotation axis A1. The plurality of chuck pins 13 is held by the spin base 12 in an outer peripheral portion of the spin base 12. The plurality of chuck pins 13 is disposed at intervals in the circumferential direction C1 (direction about the substrate rotation axis A1). Each of the chuck pins 13 can be rotated about the pin pivot axis A2 with respect to the spin base 12 between the close position where the chuck pin 13 is pressed onto a peripheral end surface of the substrate W (position of FIG. 2) and the open position where the chuck pin 13 is separated from the peripheral end surface of the substrate W. As shown in FIG. 1, the substrate W is gripped by the plurality of chuck pins 13 in a state where a lower surface of the substrate W and an upper surface of the spin base 12 are separated from each other in the up and down direction. When the spin motor 16 rotates the spin shaft 15 in this state, the substrate W is rotated about the substrate rotation axis A1 together with the spin base 12 and the chuck pins 13.

As shown in FIG. 3, each of the chuck pins 13 includes a gripping portion 41 to be pressed onto the peripheral end surface of the substrate W at the close position, and a support portion 55 that supports a lower surface peripheral edge portion of the substrate W at the open position. When the chuck pin 13 is pivoted about the pin pivot axis A2 (axis parallel with the substrate rotation axis A1) between the close position and the open position, the gripping portion 41 and the support portion 55 are horizontally moved. However, FIG. 3 depicts as if the substrate W is horizontally moved for the sake of convenience. The support portion 55 is disposed on the inner side of the gripping portion 41 (to move closer to the substrate rotation axis A1). An upper surface of the support portion 55 extends obliquely downward and inward from the gripping portion 41. When the chuck pin 13 is disposed at the close position, the gripping portion 41 is pressed onto the peripheral edge portion of the substrate W and the lower surface of the substrate W is separated from the support portion 55. Meanwhile, when the chuck pin 13 is disposed at the open position, the gripping portion 41 is separated from the peripheral edge portion of the substrate W and the lower surface of the substrate W is brought into contact with the support portion 55.

The control device 3 controls the chuck opening/closing mechanisms 14 to switch a state of the plurality of chuck pins 13 between a close state where the plurality of chuck pins 13 grips the substrate W and an open state where gripping of the substrate W by the plurality of chuck pins 13 is canceled. When the substrate W is transferred to the spin chuck 5, the control device 3 causes the chuck pins 13 to retreat to the open position. In this state, the control device 3 causes a transfer robot to mount the substrate W on the plurality of chuck pins 13. Thereby, the upper surfaces of the support portions 55 are brought into contact with the lower surface peripheral edge portion of the substrate W, so that the substrate W is supported in a horizontal posture at a support portion on the upper side of the upper surface of the spin base 12 (position shown by alternate long and short dashed line in FIG. 3).

After the substrate W is mounted on the plurality of chuck pins 13, the control device 3 moves the chuck pins 13 from the open position to the close position. Since the upper surfaces of the support portions 55 extend obliquely upward toward the gripping portions 41, the substrate W is gradually lifted up by the plurality of support portions 55 in a process where the chuck pins 13 are moved toward the close position. Further, in the process where the chuck pins 13 are moved toward the close position, the gripping portions 41 move close to the peripheral end surface of the substrate W. Thereby, the gripping portions 41 (specifically, upper side groove inner surfaces 43 and lower side groove inner surfaces 44 to be described later) are pressed onto the peripheral edge portion of the substrate W, so that the substrate W is gripped in a horizontal posture at a gripping position on the upper side of the support position (position shown by alternate long and two short dashed line in FIG. 3).

As shown in FIG. 1, the processing liquid supply device 6 includes a first chemical solution nozzle 17 that discharges a first chemical solution toward an upper surface of the substrate W, a first chemical solution pipe 18 connected to the first chemical solution nozzle 17, a first chemical solution valve 19 interposed in the first chemical solution pipe 18, a first chemical solution arm 20 in which the first chemical solution nozzle 17 is attached to a leading end portion, and a nozzle moving device 21 that moves the first chemical solution arm 20 to move a liquid landing position of the first chemical solution on the upper surface of the substrate W.

When the first chemical solution valve 19 is opened, the first chemical solution supplied from the first chemical solution pipe 18 to the first chemical solution nozzle 17 is discharged downward from the first chemical solution nozzle 17. When the first chemical solution valve 19 is closed, discharge of the first chemical solution from the first chemical solution nozzle 17 is stopped. The nozzle moving device 21 moves the first chemical solution nozzle 17 to move the liquid landing position of the first chemical solution on the upper surface of the substrate W. Further, the nozzle moving device 21 moves the first chemical solution nozzle 17 between a processing position where the first chemical solution discharged from the first chemical solution nozzle 17 is landed on the upper surface of the substrate W and a retreat position where the first chemical solution nozzle 17 retreats to a periphery of the spin chuck 5 in a plan view.

As shown in FIG. 1, the processing liquid supply device 6 includes a second chemical solution nozzle 22 that discharges a second chemical solution toward the upper surface of the substrate W, a second chemical solution pipe 23 connected to the second chemical solution nozzle 22, a second chemical solution valve 24 interposed in the second chemical solution pipe 23, a second chemical solution arm 25 in which the second chemical solution nozzle 22 is attached to a leading end portion, and a nozzle moving device 26 that moves the second chemical solution arm 25 to move a liquid landing position of the second chemical solution on the upper surface of the substrate W.

When the second chemical solution valve 24 is opened, the second chemical solution supplied from the second chemical solution pipe 23 to the second chemical solution nozzle 22 is discharged downward from the second chemical solution nozzle 22. When the second chemical solution valve 24 is closed, discharge of the second chemical solution from the second chemical solution nozzle 22 is stopped. The nozzle moving device 26 moves the second chemical solution nozzle 22 to move the liquid landing position of the second chemical solution on the upper surface of the substrate W. Further, the nozzle moving device 26 moves the second chemical solution nozzle 22 between a processing position where the second chemical solution discharged from the second chemical solution nozzle 22 is landed on the upper surface of the substrate W and a retreat position where the second chemical solution nozzle 22 retreats to the periphery of the spin chuck 5 in a plan view.

The first chemical solution and the second chemical solution are different types of chemical solutions. The first chemical solution is acid, and the second chemical solution is alkaline. Specific examples of the first chemical solution are SPM (mixture solution of sulfuric acid and hydrogen peroxide solution), phosphoric acid (phosphoric acid aqueous solution of concentration of, for example, 80% or more and less than 100%), and hydrofluoric acid. A specific example of the second chemical solution is SC1 (mixture solution of ammonia solution, hydrogen peroxide solution, and water). Any of the specific examples of the first chemical solution is a removing liquid that removes unnecessary articles such as a thin film and particles from the substrate W (an etching liquid or a cleaning liquid). Any of the specific examples of the first chemical solution is a chemical solution whose removing ability is enhanced according to an increase in a temperature.

As shown in FIG. 1, the processing liquid supply device 6 includes a rinsing liquid nozzle 27 that discharges a rinsing liquid toward the upper surface of the substrate W, a rinsing liquid pipe 28 connected to the rinsing liquid nozzle 27, a rinsing liquid valve 29 interposed in the rinsing liquid pipe 28, a rinsing liquid arm 30 in which the rinsing liquid nozzle 27 is attached to a leading end portion, and a nozzle moving device 31 that moves the rinsing liquid arm 30 to move a liquid landing position of the rinsing liquid on the upper surface of the substrate W.

When the rinsing liquid valve 29 is opened, the rinsing liquid supplied from the rinsing liquid pipe 28 to the rinsing liquid nozzle 27 is discharged downward from the rinsing liquid nozzle 27. When the rinsing liquid valve 29 is closed, discharge of the rinsing liquid from the rinsing liquid nozzle 27 is stopped. The nozzle moving device 31 moves the rinsing liquid nozzle 27 to move a liquid landing position of the rinsing liquid on the upper surface of the substrate W. Further, the nozzle moving device 31 moves the rinsing liquid nozzle 27 between a processing position where the rinsing liquid discharged from the rinsing liquid nozzle 27 is landed on the upper surface of the substrate W and a retreat position where the rinsing liquid nozzle 27 retreats to the periphery of the spin chuck 5.

The rinsing liquid to be supplied to the rinsing liquid nozzle 27 is pure water (deionized water). The rinsing liquid to be supplied to the rinsing liquid nozzle 27 is not limited to pure water but may be carbonated water, electrolyzed ion water, hydrogen water, ozone water, IPA (isopropyl alcohol), or aqueous hydrochloric acid of dilute concentration (for example, about 10 to 100 ppm).

As shown in FIG. 1, the cup 8 is disposed on the outer side of the substrate W held by the spin chuck 5 (to be separated from the substrate rotation axis A1). The cup 8 surrounds the spin base 12. When the processing liquid is supplied to the substrate W in a state where the spin chuck 5 rotates the substrate W, the processing liquid scatters from the substrate W to a periphery of the substrate W. When the processing liquid is supplied to the substrate W, an upper end portion 8a of the cup 8 opened upward is disposed on the upper side of the spin base 12. Therefore, the processing liquid discharged to the periphery of the substrate W such as the chemical solution and the rinsing liquid is received by the cup 8. The processing liquid received by the cup 8 is sent to a collection device or a draining device (not shown).

As shown in FIG. 1, the heating device 7 includes an infrared heater 32 disposed above the substrate W which is held by the spin chuck 5, a heater arm 35 in which the infrared heater 32 is attached to a leading end portion, and a heater moving device 36 that moves the heater arm 35.

As shown in FIG. 1, the infrared heater 32 includes an infrared lamp 33 that emits light containing infrared ray, and a lamp housing 34 that accommodates the infrared lamp 33. The infrared lamp 33 is disposed in the lamp housing 34. As shown in FIG. 2, the lamp housing 34 is smaller than the substrate W in a plan view. Therefore, the infrared heater 32 is smaller than the substrate W in a plan view. The infrared lamp 33 and the lamp housing 34 are attached to the heater arm 35. Therefore, the infrared lamp 33 and the lamp housing 34 are moved together with the heater arm 35.

The infrared lamp 33 is a halogen lamp. The infrared lamp 33 includes a filament and a quartz tube that accommodates the filament. The infrared lamp 33 may be a carbon heater or a heating element other than the halogen lamp and the carbon heater. At least a part of the lamp housing 34 is made of a material having light permeability and heat resistance such as quartz. Therefore, when the infrared lamp 33 emits the light, the light from the infrared lamp 33 permeates the lamp housing 34 and is emitted from an outer surface of the lamp housing 34.

As shown in FIG. 1, the lamp housing 34 has a bottom wall parallel with the upper surface of the substrate W. The infrared lamp 33 is disposed above the bottom wall. A lower surface of the bottom wall includes a flat irradiation surface 32a parallel with the upper surface of the substrate W. In a state where the infrared heater 32 is disposed above the substrate W, the irradiation surface 32a of the lamp housing 34 faces the upper surface of the substrate W through a gap in the up and down direction. When the infrared lamp 33 emits the light in this state, the light containing the infrared ray is directed to the upper surface of the substrate W from the irradiation surface 32a of the lamp housing 34 and irradiated to the upper surface of the substrate W. The irradiation surface 32a has, for example, a circular shape whose diameter is smaller than the radius of the substrate W. The irradiation surface 32a is not limited to the circular shape but may have a rectangular shape whose longitudinal length is equal to or more than the radius of the substrate W, or may have a shape other than the circular shape and the rectangular shape.

As shown in FIG. 1, the heater moving device 36 holds the infrared heater 32 at a predetermined height. The heater moving device 36 pivots the heater arm 35 about the heater pivot axis A3 extending in the up and down direction in the periphery of the spin chuck 5 to horizontally move the infrared heater 32. Thereby, an irradiation position where the infrared ray is irradiated (partial region in the upper surface of the substrate W) is moved in the upper surface of the substrate W. As shown in FIG. 2, the heater moving device 36 horizontally moves the infrared heater 32 along an arc trajectory passing through the center of the substrate W in a plan view. Therefore, the infrared heater 32 is moved in a horizontal plane including the upper side of the spin chuck 5. The heater moving device 36 moves the infrared heater 32 in the vertical direction to change a distance between the irradiation surface 32a and the substrate W.

The light from the infrared heater 32 is irradiated to the irradiation position in the upper surface of the substrate W. In a state where the infrared heater 32 emits the infrared ray, the control device 3 rotates the substrate W by the spin chuck 5 while pivoting the infrared heater 32 about the heater pivot axis A3 by the heater moving device 36. Thereby, the upper surface of the substrate W is scanned as the irradiation position serving as a heating position. Therefore, the light containing the infrared ray is absorbed by the upper surface of the substrate W, and radiation heat is transmitted from the infrared lamp 33 to the substrate W. Thus, when the infrared lamp 33 emits the infrared ray in a state where the liquid such as the processing liquid is held on the substrate W, the temperatures of the substrate W and the processing liquid are increased.

Figure 4:
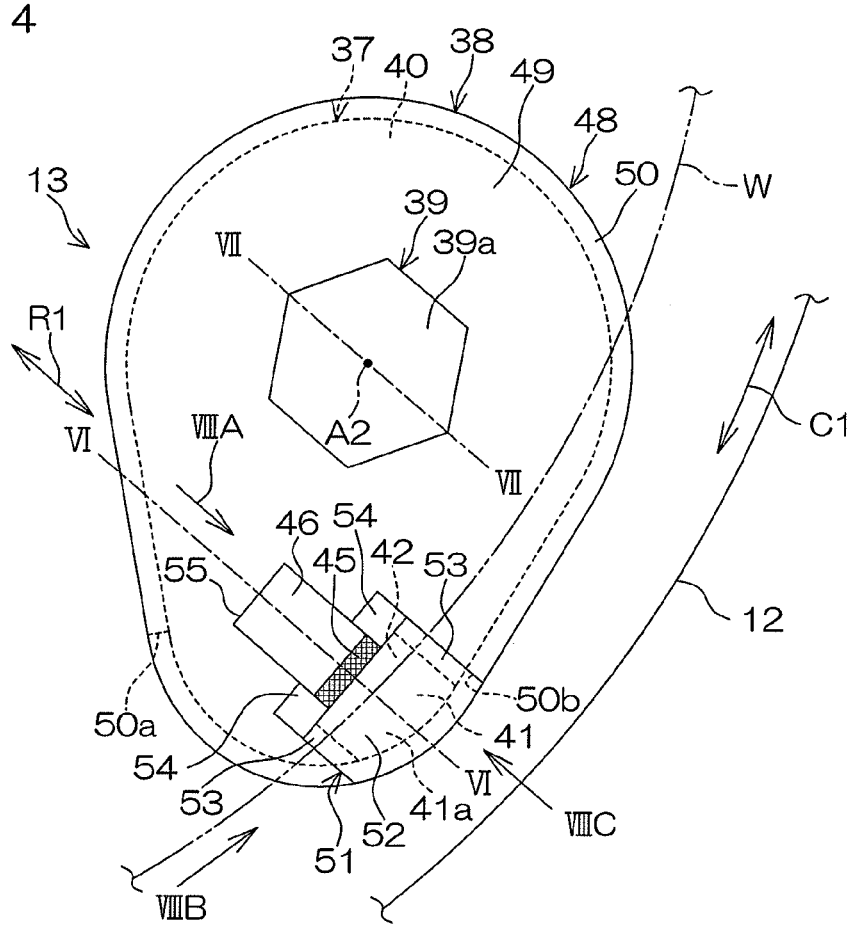
FIG. 4 is a schematic plan view of the chuck pin.
Figure 5:
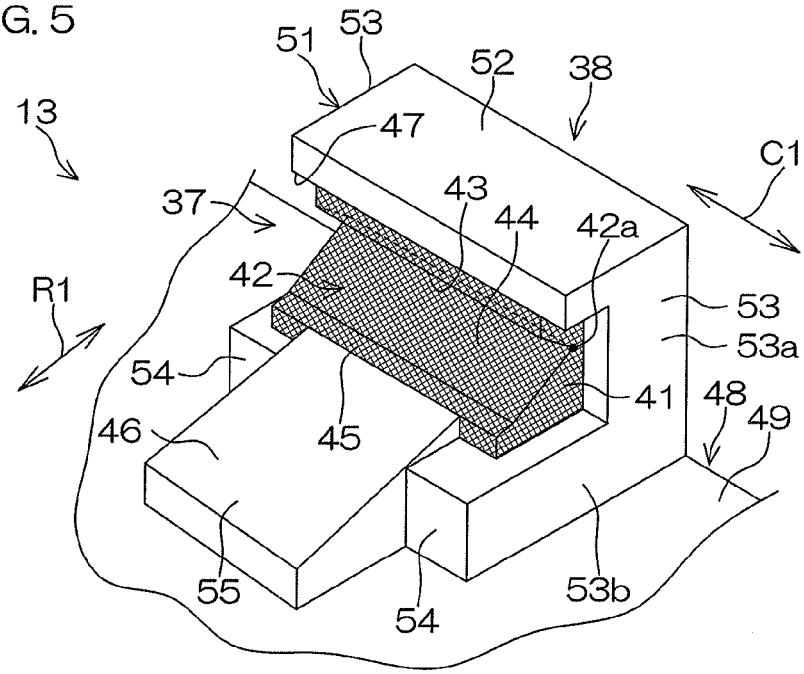
FIG. 5 is a schematic perspective view of the chuck pin showing a gripping portion and a pin covering portion.
Figure 6:
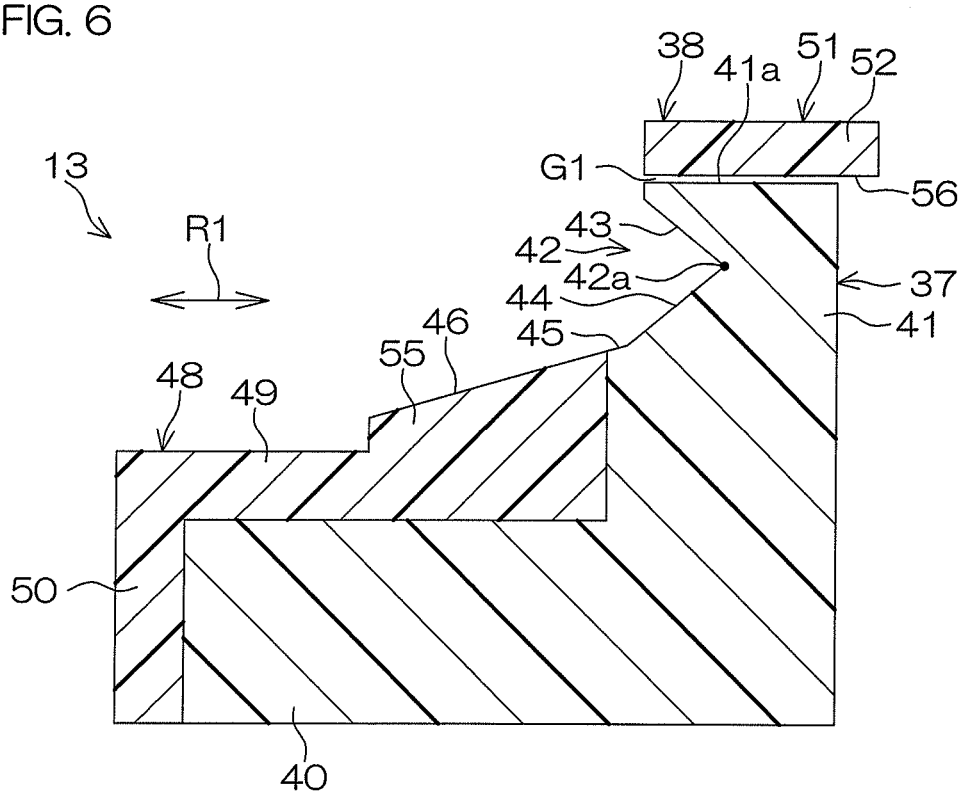
FIG. 6 is a schematic sectional view of the chuck pin taken along line VI-VI shown in FIG. 4.
Figure 7:
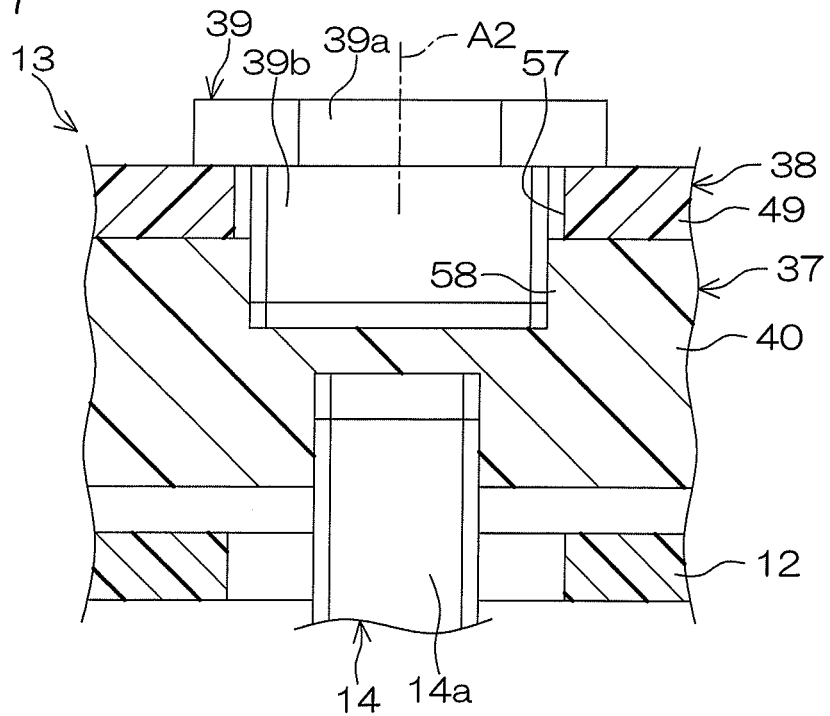
FIG. 7 is a schematic sectional view of the chuck pin taken along line VII-VII shown in FIG. 4.
Figure 8:
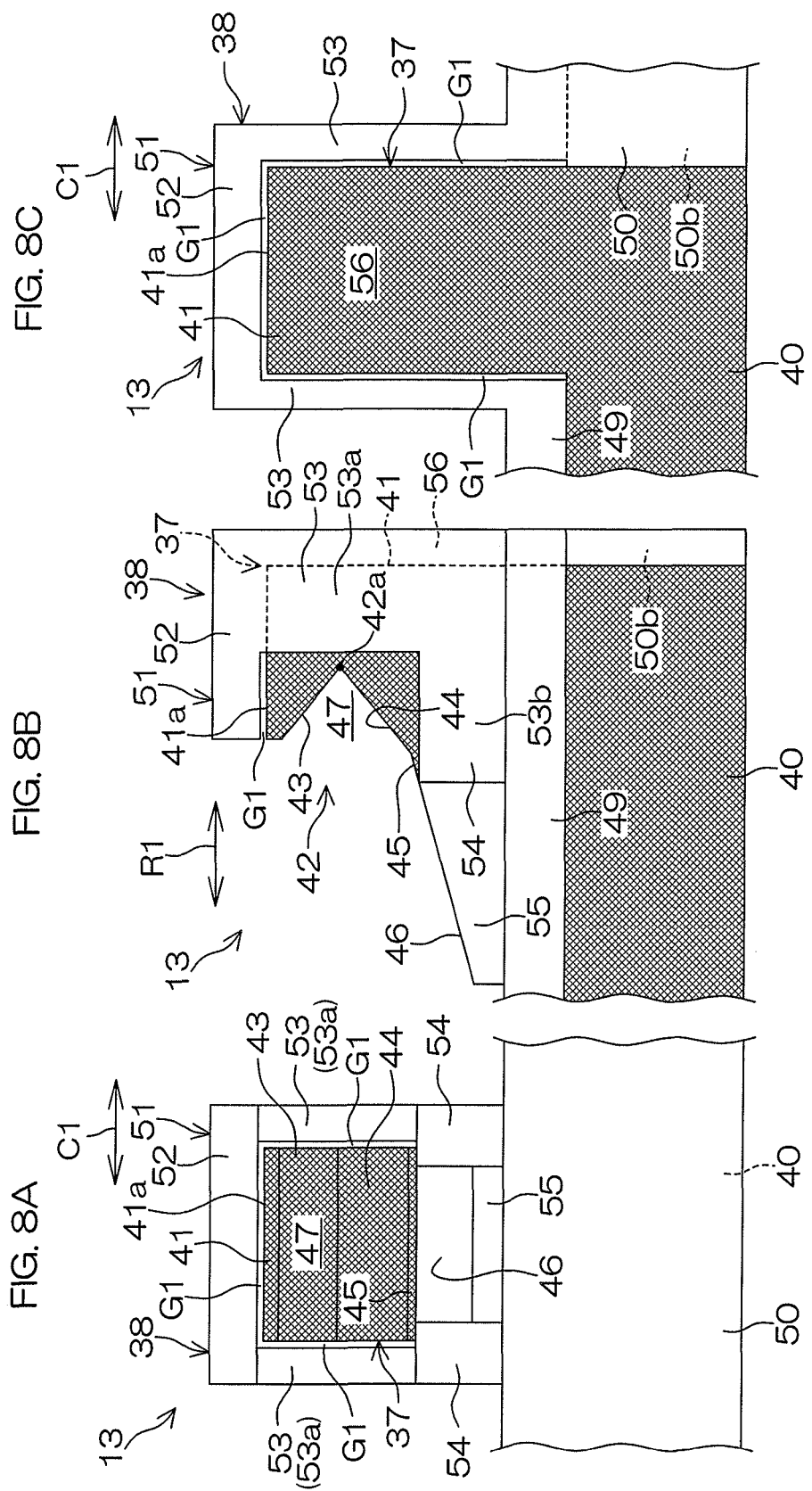
FIG. 8A is a schematic view in which the chuck pin is seen in the direction of arrow VIIIA shown in FIG. 4.
FIG. 8B is a schematic view in which the chuck pin is seen in the direction of arrow VIIIB shown in FIG. 4.
FIG. 8C is a schematic view in which the chuck pin is seen in the direction of arrow VIIIC shown in FIG. 4.

FIG. 4 is a schematic plan view of the chuck pin 13. FIG. 5 is a schematic perspective view of the chuck pin 13 showing the gripping portion 41 and a pin covering portion 51. FIG. 6 is a schematic sectional view of the chuck pin 13 taken along line VI-VI shown in FIG. 4. FIG. 7 is a schematic sectional view of the chuck pin 13 taken along line VII-VII shown in FIG. 4. FIG. 8A is a schematic view in which the chuck pin 13 is seen in the direction of arrow VIIIA shown in FIG. 4. FIG. 8B is a schematic view in which the chuck pin 13 is seen in the direction of arrow VIIIB shown in FIG. 4. FIG. 8C is a schematic view in which the chuck pin 13 is seen in the direction of arrow VIIIC shown in FIG. 4. In FIGS. 4, 5, 8A, 8B, and 8C, a conductive member 37 is shown by cross-hatching.

As shown in FIG. 4, the chuck pin 13 includes the conductive member 37 having conductivity, a pin cover 38 that covers the conductive member 37, and a coupling member 39 that couples the conductive member 37 and the pin cover 38.

As shown in FIG. 4, the conductive member 37, the pin cover 38, and the coupling member 39 are disposed above the spin base 12. The conductive member 37, the pin cover 38, and the coupling member 39 are disposed on the inner side of an outer peripheral surface of the spin base 12. As shown in FIGS. 6 and 7, the conductive member 37, the pin cover 38, and the coupling member 39 are different members from each other. The pin cover 38 is detachably attached to the conductive member 37, and fixed to the conductive member 37 by the coupling member 39. As shown in FIG. 7, the conductive member 37 is fixed to a drive shaft 14a of the chuck opening/closing mechanism 14 protruding upward from the upper surface of the spin base 12. The drive shaft 14a extends in the up and down direction along the pin pivot axis A2. The coupling member 39 is disposed above the drive shaft 14a. The drive shaft 14a is pivoted about the pin pivot axis A2 together with the conductive member 37. Thereby, the conductive member 37, the pin cover 38, and the coupling member 39 are integrally driven about the pin pivot axis A2 between the close position and the open position.

The conductive member 37 is made of a composite material softer than the substrate W, the composite material having chemical resistance and conductivity. A specific example of the composite material is a material containing resin and carbon. The conductive member 37 may be made by alternately laminating a resin material containing resin and a carbon material containing carbon, or may be made of a resin material inside which a carbon material is dispersed. Carbon to be contained in the conductive member 37 may be carbon fiber or carbon powder or particles. Specific examples of resin to be contained in the conductive member 37 are PFA (tetrafluoro ethylene-perfluoro alkylvinyl ether copolymer), PCTFE (poly chloro tri-fluoro ethylene), PTFE (polytetrafluoroethylene), and PEEK (polyetheretherketone). Any of the resins is softer than the substrate W and has chemical resistance.

The pin cover 38 is made of a resin material softer than the substrate W, the resin material having chemical resistance. Specific examples of resin to be contained in the pin cover 38 are PTFE, ETFE (ethylene tetrafluoroethylene), and PEEK. Any of the resins is softer than the substrate W and has chemical resistance. In the present preferred embodiment, the pin cover 38 is made of white (including pure white and milky white) PTFE, and has a white outer surface. Since black carbon is contained in the conductive member as described above, an outer surface of the conductive member 37 is black. Therefore, the outer surface of the pin cover 38 has higher reflectivity of the light (visible ray) than that of the outer surface of the conductive member 37. In other words, the outer surface of the pin cover 38 has lower absorptivity of the light (visible ray) than that of the outer surface of the conductive member 37. In view of reflectivity of the light (visible ray), the outer surface of the pin cover 38 has higher reflectivity than that of the outer surface of the conductive member 37.

As shown in FIG. 4, the pin cover 38 is disposed above the conductive member 37. The pin cover 38 overlays the conductive member 37 in a plan view, and major parts of the conductive member 37 are hidden by the pin cover 38 in a plan view. A part of the conductive member 37 (upper side inclination surface 45 to be described later) is exposed from the pin cover 38 in a plan view and can be visually recognized in a plan view. This part of the conductive member 37 is a part to be hidden by the substrate W in a state where the plurality of chuck pins 13 grips the substrate W. Therefore, in a state where the plurality of chuck pins 13 grips the substrate W, the entire conductive member 37 is hidden by the substrate W and the pin cover 38. Thus, even when the infrared heater 32 emits the light in a state where the plurality of chuck pins 13 grips the substrate W, the light from the infrared heater 32 is blocked by the substrate W and the pin cover 38.

As shown in FIG. 6, the conductive member 37 includes a base portion 40 disposed above the spin base 12, and the gripping portion 41 protruding upward from an upper surface of the base portion 40.

As shown in FIG. 4, an area of the base portion 40 in a plan view is larger than an area of the gripping portion 41 in a plan view. The base portion 40 crosses the pin pivot axis A2. Meanwhile, the gripping portion 41 does not cross the pin pivot axis A2. Therefore, the gripping portion 41 is disposed in a periphery of the pin pivot axis A2. As shown in FIG. 7, the base portion 40 is coupled to the drive shaft 14a of the chuck opening/closing mechanism 14. The base portion 40 is driven about the pin pivot axis A2 by the chuck opening/closing mechanism 14. The base portion 40 is pivoted about the pin pivot axis A2 together with the gripping portion 41.

As shown in FIG. 6, the gripping portion 41 includes two groove inner surfaces 43, 44 that form an accommodation groove 42 having a V-shaped vertical section (section cut by a vertical plane) opened inward (leftward in FIG. 6), and the upper side inclination surface 45 that extends obliquely downward and inward from a lower end of the two groove inner surfaces 43, 44 (inner end of the lower side groove inner surface 44). The two groove inner surfaces 43, 44 include the upper side groove inner surface 43 that extends obliquely upward and inward from a bottom 42a of the accommodation groove 42, and the lower side groove inner surface 44 that extends obliquely downward and inward from the bottom 42a of the accommodation groove 42.

As shown in FIG. 6, the upper side groove inner surface 43 and the lower side groove inner surface 44 are inclined with respect to a horizontal plane at an angle equal to each other in the opposite directions to each other. The upper side inclination surface 45 is disposed below the upper side groove inner surface 43 and the lower side groove inner surface 44. Therefore, the upper side inclination surface 45 is disposed below the accommodation groove 42. The upper side inclination surface 45 is disposed on the inner side of the lower side groove inner surface 44 and continues to the lower side groove inner surface 44. The upper side inclination surface 45 is inclined with respect to a horizontal plane at an angle smaller than an inclination angle of the lower side groove inner surface 44 with respect to a horizontal plane. The radial length of the upper side inclination surface 45 (length in the radial direction R1 (direction orthogonal to the substrate rotation axis A1)) is smaller than the radial length of the upper side groove inner surface 43 and the lower side groove inner surface 44. As shown in FIG. 5, the circumferential length of the upper side inclination surface 45 is equal to the circumferential length of the upper side groove inner surface 43, and equal to the circumferential length of the lower side groove inner surface 44. The circumferential length of the upper side inclination surface 45 is larger than the circumferential length of the upper surface of the support portion 55 (lower side inclination surface 46 to be described later).

As shown in FIGS. 4 and 5, the pin cover 38 includes a base covering portion 48 that covers the base portion 40, and the pin covering portion 51 that covers the gripping portion 41.

As shown in FIG. 6, the base covering portion 48 is integrated with the pin covering portion 51. The pin covering portion 51 extends upward from the base covering portion 48. The base portion 40 is accommodated in the base covering portion 48, and the gripping portion 41 is accommodated in the pin covering portion 51. As shown in FIG. 5, the pin covering portion 51 defines an inward opening 47 that is open inward. The inward opening 47 extends inward from the gripping portion 41 to an outside of the pin covering portion 51. Therefore, the gripping portion 41 is exposed from the inward opening 47. The inward opening 47 continues to a gap G1 between an inner surface of the pin covering portion 51 and an outer surface of the gripping portion 41.

As shown in FIG. 4, the base covering portion 48 includes a lower side upper wall 49 disposed above the base portion 40, and a peripheral wall 50 disposed in a periphery of the base portion 40.

As shown in FIG. 4, the lower side upper wall 49 overlays the entire region of the base portion 40 in a plan view. The lower side upper wall 49 covers the entire base portion 40 in a plan view, and the entire base portion 40 is hidden by the base covering portion 48 (lower side upper wall 49) in a plan view. The peripheral wall 50 extends downward from an outer peripheral portion of the lower side upper wall 49. The peripheral wall 50 extends along the outer peripheral portion of the lower side upper wall 49 in a plan view. The peripheral wall 50 has a C-shaped configuration in a plan view and includes one end portion 50a and the other end portion 50b. The one end portion 50a of the peripheral wall 50 is disposed on the inner side of the pin covering portion 51, and the other end portion 50b of the peripheral wall 50 is disposed on the outer side of the one end portion 50a of the peripheral wall 50 (also refer to FIG. 8C). The one end portion 50a of the peripheral wall 50 and the other end portion 50b of the peripheral wall 50 define a part of an outward opening 56 to be described later.

As shown in FIG. 5, the pin covering portion 51 includes an upper side upper wall 52 disposed above the gripping portion 41, two side walls 53 disposed on both sides of the gripping portion 41 in the circumferential direction C1, two inner walls 54 disposed on the inner side of the gripping portion 41 while being spaced from each other in the circumferential direction C1, and the support portion 55 disposed on the inner side of the gripping portion 41 between the two inner walls 54.

As shown in FIG. 5, the side walls 53, the inner walls 54, and the support portion 55 protrude upward from an upper surface of the base covering portion 48 (upper surface of the lower side upper wall 49). Upper end portions of the side walls 53 are disposed on the upper side of the inner walls 54 and the support portion 55. The two side walls 53 are disposed and spaced apart in the circumferential direction C1. The upper side upper wall 52 extends from the upper end portion of one of the side walls 53 to the upper end portion of the other side wall 53. The upper side upper wall 52 is disposed on the upper side of the inner walls 54 and the support portion 55. The inner walls 54 extend from inner end portions of the side walls 53 to the support portion 55 in the circumferential direction C1. The support portion 55 is disposed on the inner side of the accommodation groove 42, and circumferential length thereof is smaller than circumferential length of the upper side upper wall 52. As shown in FIGS. 3 and 6, the support portion 55 is disposed on the lower side of the accommodation groove 42, and extends obliquely upward toward the accommodation groove 42. Therefore, the height of the support portion 55 is increased as it moves closer to the accommodation groove 42. Upper ends of the inner walls 54 are disposed on the lower side of an outer end of the support portion 55.

As shown in FIGS. 8A, 8B, and 8C, the upper side groove inner surface 43 and the lower side groove inner surface 44 are disposed at a height between the upper side upper wall 52 and the support portion 55. Similarly, the upper side inclination surface 45 is disposed at a height between the upper side upper wall 52 and the support portion 55. An inner end of the upper side upper wall 52 is disposed above an inner end of the upper side groove inner surface 43. The bottom 42a of the accommodation groove 42 is disposed on the outer side of the inner end of the upper side upper wall 52. Each of the side walls 53 includes an outer side portion 53a disposed on the outer side of the upper side groove inner surface 43 and the lower side groove inner surface 44, and a lower side portion 53b disposed on the lower side of the upper side groove inner surface 43 and the lower side groove inner surface 44. The outer side portion 53a extends upward from the lower side portion 53b to the upper side upper wall 52. An inner end of the outer side portion 53a is disposed on the outer side of the upper side groove inner surface 43 and the lower side groove inner surface 44. Therefore, when the accommodation groove 42 is horizontally seen in the circumferential direction C1, the entire accommodation groove 42 is exposed from the pin cover 38 (refer to FIG. 8B). Thus, when the gripping portion 41 grips the substrate W, the substrate W is not brought into contact with the pin cover 38.

As shown in FIG. 6, the support portion 55 includes the lower side inclination surface 46 that extends obliquely downward and inward from a lower end of the upper side inclination surface 45 (inner end of the upper side inclination surface 45).

As shown in FIG. 6, the lower side inclination surface 46 is disposed on the lower side of the accommodation groove 42. The lower side inclination surface 46 is disposed on the inner side of the upper side inclination surface 45, and continues to the upper side inclination surface 45. The lower side inclination surface 46 is inclined with respect to a horizontal plane at an inclination angle equal to the inclination angle of the upper side inclination surface 45 with respect to a horizontal plane. The radial length of the lower side inclination surface 46 is larger than the radial length of the upper side inclination surface 45. The lower surface peripheral edge portion of the substrate W is supported by the lower side inclination surface 46. Since the lower side inclination surface 46 is inclined to extend obliquely downward and inward, the substrate W is supported by the lower side inclination surface 46 in line contact or in point contact. When the chuck pins 13 are moved from the open position to the close position in a state where the substrate W is supported by the plurality of lower side inclination surfaces 46, the peripheral edge portion of the substrate W is moved into the accommodation groove 42 after passing through the lower side inclination surfaces 46 and the upper side inclination surfaces 45 in this order. Thereby, the upper side groove inner surfaces 43 and the lower side groove inner surfaces 44 are pressed onto the peripheral edge portion of the substrate W, so that the substrate W is held in a horizontal posture by the plurality of chuck pins 13.

As shown in FIGS. 8A, 8B, and 8C, in the pin cover 38, the outward opening 56 opened outward is defined by the base covering portion 48 and the pin covering portion 51.

As shown in FIGS. 8A, 8B, and 8C, the outward opening 56 is disposed on the outer side of the inward opening 47. The outward opening 56 extends outward from the gripping portion 41 to the outside of the pin covering portion 51. Therefore, the outward opening 56 is disposed on the outer side of the gripping portion 41. The outward opening 56 continues to the gap G1 between the inner surface of the pin covering portion 51 and the outer surface of the gripping portion 41. The outward opening 56 extends from the height on the upper side of an upper surface 41a of the gripping portion 41 to the height on the lower side of the gripping portion 41. The outward opening 56 is opened outward and also opened downward. The outward opening 56 may extend from a height equal to a part of the gripping portion 41 to a height on the lower side of the gripping portion 41.

As shown in FIG. 7, the coupling member 39 includes a head portion 39a disposed above the pin cover 38, and a shaft portion 39b that extends downward from the head portion 39a.

As shown in FIG. 7, the head portion 39a and the shaft portion 39b are disposed above the drive shaft 14a of the chuck opening/closing mechanism 14. The shaft portion 39b extends in the up and down direction along the pin pivot axis A2. The shaft portion 39b is inserted into an attachment hole 57 passing through the lower side upper wall 49 of the pin cover 38 in the up and down direction. The shaft portion 39b is further screwed into a female screw hole 58 provided in the base portion 40 of the conductive member 37. A part of the pin cover 38 (part of the lower side upper wall 49) is disposed between the head portion 39a of the coupling member 39 and the base portion 40 of the conductive member 37, and fastened in the axial direction of the coupling member 39 (axial direction of the shaft portion 39b) by the coupling member 39 and the conductive member 37. Thereby, the pin cover 38 is fixed to the conductive member 37.

Figure 9:
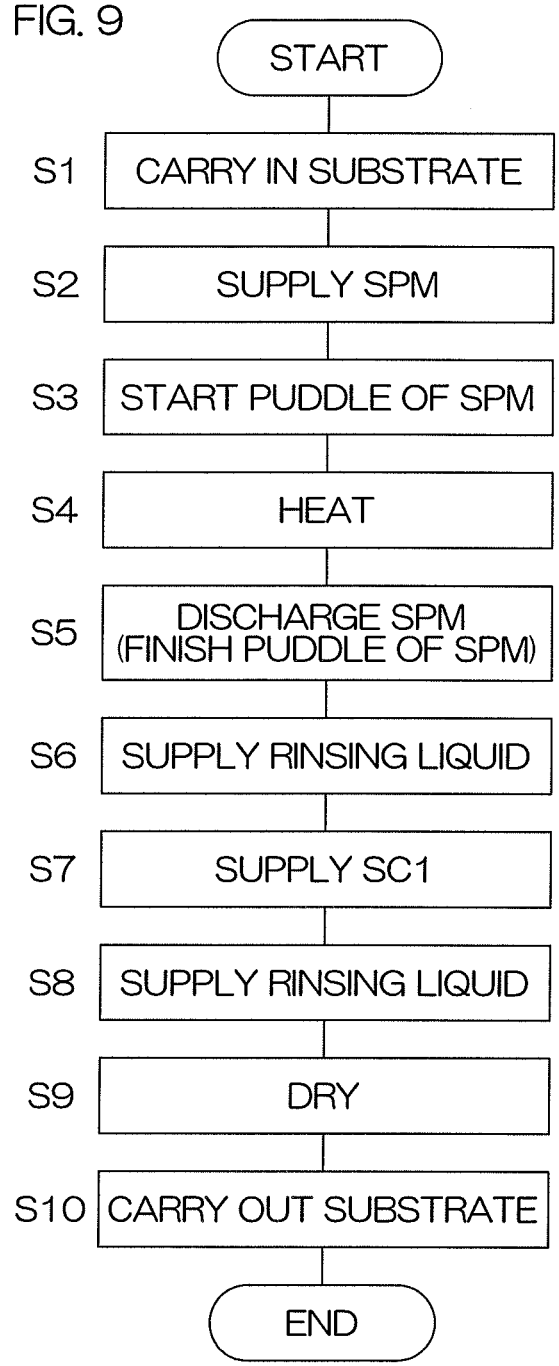
FIG. 9 is a flowchart for illustrating one example of processing of a substrate performed by a processing unit.

FIG. 9 is a flowchart for illustrating one example of processing of the substrate W performed by the processing unit 2. Hereinafter, FIG. 1 will be referred. FIG. 9 will be referred appropriately.

Hereinafter, an example of processing a silicon substrate will be described. The substrate W is not limited to a silicon substrate but may be, for example, a silicon carbide substrate, a sapphire substrate, a gallium nitride substrate, a gallium arsenide substrate, or the like.

When the substrate W is processed by the processing unit 2, a carry-in step (Step S1 of FIG. 9) of carrying the substrate W into the chamber 4 is performed. Specifically, the control device 3 causes the hand of the transfer robot holding the substrate W to enter into the chamber 4 in a state where all the nozzles retreat from the upper side of the spin chuck 5. The control device 3 also causes the transfer robot to put the substrate W on the plurality of chuck pins 13. After that, the control device 3 causes the hand of the transfer robot to retreat from the chamber 4. The control device 3 moves the chuck pins 13 from the open position to the close position after the substrate W is mounted on the plurality of chuck pins 13. After that, the control device 3 starts rotation of the substrate W by the spin motor 16.

Next, a first chemical solution supplying step (Step S2 of FIG. 9) of supplying SPM serving as one example of the first chemical solution to the substrate W is performed. Specifically, the control device 3 controls the nozzle moving device 21 to move the first chemical solution nozzle 17 from the retreat position to the processing position. Thereby, the first chemical solution nozzle 17 is disposed above the substrate W. After that, the control device 3 opens the first chemical solution valve 19 and causes the first chemical solution nozzle 17 to discharge SPM at a temperature (such as 140° C.) higher than the room temperature toward the upper surface (a front surface on which device is to be formed) of the substrate W in a rotated state. The control device 3 controls the nozzle moving device 21 in this state to move a liquid landing position of SPM on the upper surface of the substrate W between a center portion and the peripheral edge portion.

SPM discharged from the first chemical solution nozzle 17 is landed on the upper surface of the substrate W and then flows outward along the upper surface of the substrate W by the centrifugal force. Therefore, SPM is supplied to the entire upper surface of the substrate W, so that a liquid film of SPM covering the entire upper surface of the substrate W is formed on the substrate W. Thereby, foreign substances such as a resist film are removed from the substrate W by SPM. Further, the control device 3 moves the liquid landing position of SPM on the upper surface of the substrate W between the center portion and the peripheral edge portion in a state where the substrate W is rotated. Thus, the liquid landing position of SPM passes through the entire upper surface of the substrate W, so that the entire upper surface of the substrate W is scanned. Therefore, SPM discharged from the first chemical solution nozzle 17 is directly blown off the entire upper surface of the substrate W, so that the entire upper surface of the substrate W is uniformly processed.

Next, a puddle step (Step S3 of FIG. 9) of holding the liquid film of SPM on the substrate W in a state where supply of SPM to the substrate W is stopped is performed. Specifically, the control device 3 controls the spin chuck 5 to lower the rotation speed of the substrate W to low rotation speed (such as 1 to 30 rpms) smaller than the rotation speed of the substrate W in the first chemical solution supplying step in a state where the entire upper surface of the substrate W is covered by the liquid film of SPM. Therefore, the centrifugal force acting on SPM on the substrate W is weakened, so that the amount of SPM discharged from an upper portion of the substrate W is reduced. The control device 3 closes the first chemical solution valve 19 in a state where the substrate W is rotated at low rotation speed, to stop discharge of SPM from the first chemical solution nozzle 17. Thereby, in a state where the supply of SPM to the substrate W is stopped, the liquid film of SPM covering the entire upper surface of the substrate W is held on the substrate W. The control device 3 stops the supply of SPM to the substrate W and then controls the nozzle moving device 21 to cause the first chemical solution nozzle 17 to retreat from the upper side of the spin chuck 5.

Next, a heating step (Step S4 of FIG. 9) of heating the substrate W and SPM on the substrate W is performed in parallel with the puddle step. Specifically, the control device 3 starts light emission from the infrared heater 32. Thereby, the temperature (heating temperature) of the infrared heater 32 is increased to a temperature higher than the boiling point of the first chemical solution (SPM in this processing example) and maintained at the temperature. After that, the control device 3 moves the infrared heater 32 from the retreat position to the processing position by the heater moving device 36. After the infrared heater 32 is disposed above the substrate W, the control device 3 horizontally moves the infrared heater 32 by the heater moving device 36 such that the irradiation position of the infrared ray in the upper surface of the substrate W is moved from one of the center portion and the peripheral edge portion to the other portion. After the substrate W is heated by the infrared heater 32 for a predetermined time, the control device 3 causes the infrared heater 32 to retreat from the upper side of the substrate W. After that, the control device 3 stops the light emission of the infrared heater 32. In addition, the light emission and movement of the infrared heater 32 may be performed at the same time or the light emission may be started after the movement.

In such a way, the control device 3 moves the irradiation position of the infrared ray in the upper surface of the substrate W from one of the center portion and the peripheral edge portion to the other portion in a state where the substrate W is rotated. Thus, the substrate W is uniformly heated. Therefore, the liquid film of SPM covering the entire upper surface of the substrate W is also uniformly heated. The heating temperature of the substrate W by the infrared heater 32 is set to be a temperature equal to or higher than the boiling point of SPM at the concentration. Therefore, SPM on the substrate W is heated to the boiling point at the concentration. Particularly, in a case where the heating temperature of the substrate W by the infrared heater 32 is set to be a temperature higher than the boiling point of SPM at the concentration, the temperature of an interface between the substrate W and SPM is maintained at a temperature higher than the boiling point, so that removal of foreign substances from the substrate W is facilitated.

Next, a first chemical solution discharge step (Step S5 of FIG. 9) of discharging SPM on the substrate W is performed. Specifically, the control device 3 controls the spin chuck 5 to rotate the substrate W at a higher rotation speed than the rotation speed of the substrate W in the puddle step in a state where the supply of the liquid to the substrate W is stopped. Thereby, the centrifugal force larger than that of the puddle step is applied to SPM on the substrate W, so that SPM on the substrate W is shaken off to the periphery of the substrate W. Therefore, almost all SPM is discharged from the upper portion of the substrate W. SPM scattered to the periphery of the substrate is received by the cup 8 and guided to the collection device or the draining device via the cup 8.

Next, a first rinsing liquid supplying step (Step S6 of FIG. 9) of supplying pure water serving as one example of the rinsing liquid to the substrate is performed. Specifically, the control device 3 controls the nozzle moving device 31 to move the rinsing liquid nozzle 27 from the retreat position to the processing position. After the rinsing liquid nozzle 27 is disposed above the substrate, the control device 3 opens the rinsing liquid valve 29 and causes the rinsing liquid nozzle 27 to discharge pure water toward the upper surface of the substrate in a rotated state. Thereby, a liquid film of pure water covering the entire upper surface of the substrate is formed, so that SPM remaining on the substrate is washed away by pure water. When a predetermined time elapses after the rinsing liquid valve 29 is opened, the control device 3 closes the rinsing liquid valve 29 to stop discharge of pure water. After that, the control device 3 controls the nozzle moving device 31 to cause the rinsing liquid nozzle 27 to retreat from the upper side of the substrate.

Next, a second chemical solution supplying step (Step S7 of FIG. 9) of supplying SC1 serving as one example of the second chemical solution to the substrate is performed. Specifically, the control device 3 controls the nozzle moving device 26 to move the second chemical solution nozzle 22 from the retreat position to the processing position. After the second chemical solution nozzle 22 is disposed above the substrate, the control device 3 opens the second chemical solution valve 24 and causes the second chemical solution nozzle 22 to discharge SC1 toward the upper surface of the substrate in a rotated state. The control device 3 controls the nozzle moving device 26 in this state to move a liquid landing position of SC1 on the upper surface of the substrate between the center portion and the peripheral edge portion. When a predetermined time elapses after the second chemical solution valve 24 is opened, the control device 3 closes the second chemical solution valve 24 to stop discharge of SC1. After that, the control device 3 controls the nozzle moving device 26 to cause the second chemical solution nozzle 22 to retreat from the upper side of the substrate.

SC1 discharged from the second chemical solution nozzle 22 is landed on the upper surface of the substrate and then flows outward along the upper surface of the substrate by the centrifugal force. Therefore, pure water on the substrate is pushed outward by SC1 and discharged to the periphery of the substrate. Thereby, the liquid film of pure water on the substrate is replaced with a liquid film of SC1 covering the entire upper surface of the substrate. Further, the control device 3 moves the liquid landing position of SC1 on the upper surface of the substrate between the center portion and the peripheral edge portion in a state where the substrate is rotated. Thus, the liquid landing position of SC1 passes through the entire upper surface of the substrate, so that the entire upper surface of the substrate is scanned. Therefore, SC1 discharged from the second chemical solution nozzle 22 is directly blown off the entire upper surface of the substrate, so that the entire upper surface of the substrate is uniformly processed.

Next, a second rinsing liquid supplying step (Step S8 of FIG. 9) of supplying pure water serving as one example of the rinsing liquid to the substrate is performed. Specifically, the control device 3 controls the nozzle moving device 31 to move the rinsing liquid nozzle 27 from the retreat position to the processing position. After the rinsing liquid nozzle 27 is disposed above the substrate, the control device 3 opens the rinsing liquid valve 29 and causes the rinsing liquid nozzle 27 to discharge pure water toward the upper surface of the substrate in a rotated state. Thereby, SC1 on the substrate is pushed outward by pure water and discharged to the periphery of the substrate. Therefore, the liquid film of SC1 on the substrate is replaced with a liquid film of pure water covering the entire upper surface of the substrate. When a predetermined time elapses after the rinsing liquid valve 29 is opened, the control device 3 closes the rinsing liquid valve 29 to stop discharge of pure water. After that, the control device 3 controls the nozzle moving device 31 to cause the rinsing liquid nozzle 27 to retreat from the upper side of the substrate.

Next, a drying step (Step S9 of FIG. 9) of drying the substrate is performed. Specifically, the control device 3 accelerates the rotation of the substrate by the spin chuck 5 to rotate the substrate at a high rotation speed (such as several thousand rpms) higher than the rotation speed from the first chemical solution supplying step to the second rinsing liquid supplying step. Thereby, large centrifugal force is applied to the liquid on the substrate, so that the liquid attached to the substrate is shaken off to the periphery of the substrate. In such a way, the liquid is removed from the substrate, so that the substrate is dried. When a predetermined time elapses after high speed rotation of the substrate is started, the control device 3 controls the spin motor 16 to stop the rotation of the substrate by the spin chuck 5.

Next, a carry-out step (Step S10 of FIG. 9) of carrying out the substrate from the chamber 4 is performed. Specifically, the control device 3 moves the chuck pins 13 from the close position to the open position to cancel gripping of the substrate by the spin chuck 5. After that, the control device 3 causes the hands of the transfer robot to enter into the chamber 4 in a state where all the nozzles retreat from the upper side of the spin chuck 5. The control device 3 causes the hands of the transfer robot to hold the substrate on the spin chuck 5. After that, the control device 3 causes the hands of the transfer robot to retreat from the chamber 4. Thereby, the processed substrate is carried out from the chamber 4.

As described above, in the present preferred embodiment, each of the chuck pins 13 includes the conductive member 37 having conductivity and the pin cover 38 that covers the conductive member 37. The conductive member 37 is made of the material containing carbon and has conductivity. The conductive member 37 includes the gripping portion 41 to be pressed onto the peripheral edge portion of the substrate. Therefore, the part in contact with the substrate during the rotation of the substrate (gripping portion 41) has conductivity. Thus, electrification of the substrate due to the rotation of the substrate, electrification of the substrate due to supply of the electrically-charged processing liquid, and the like can be suppressed or prevented. Furthermore, since the conductive member 37 is softer than the substrate, damage to the substrate due to contact between the substrate and the conductive member 37 can be suppressed or prevented.

In a state where the plurality of gripping portions 41 is pressed onto the peripheral edge portion of the substrate, a part of the conductive member 37 is disposed in the periphery of the substrate in a plan view. The pin cover 38 covers, in a plan view, the entire region of the protruding portion (part of the conductive member 37) protruding outward from an outer peripheral edge of the substrate in a plan view in a state where the plurality of gripping portions 41 is pressed onto the peripheral edge portion of the substrate. Therefore, a part of the conductive member 37 is protected from a heat source by the pin cover 38. Even when the other part of the conductive member 37 placed below the substrate is exposed from the pin cover 38 in a plan view, this part is protected from the heat source by the substrate. Therefore, the entire conductive member 37 is protected from the heat source. Thereby, deformation of the chuck pin 13 due to heating can be prevented.

In the present preferred embodiment, the infrared lamp 33 is disposed above the substrate gripped by the spin chuck 5. The infrared lamp 33 emits the light toward the substrate. Thereby, the light is irradiated to the substrate, and at least one of the substrate and the processing liquid on the substrate is heated. The pin cover 38 that covers the conductive member 37 has higher reflectivity of the light than that of the conductive member 37. Therefore, the pin cover 38 is less likely to be heated than the conductive member 37, and the temperature thereof is less likely to be increased than that of the conductive member 37. Thus, the pin cover 38 can not only protect the conductive member 37 from the light of the infrared lamp 33 but also suppress an increase in the temperature of the pin cover 38 itself. Thereby, an increase in the temperature of the chuck pin 13 can be suppressed.

In the present preferred embodiment, the pin cover 38 has the white outer surface that easily reflects the light. Meanwhile, the conductive member 37 is made of the material containing black carbon, and has the black outer surface. Therefore, the pin cover 38 has higher reflectivity of the light than that of the conductive member 37. Further, since the outer surface of the pin cover 38 is white that easily reflects the light, an amount of the light to be absorbed by the pin cover 38 can be reduced, so that the increase in the temperature of the pin cover 38 itself can be efficiently suppressed.

In the above preferred embodiment, the support portion 55 that supports the lower surface peripheral edge portion of the substrate is provided in the pin cover 38. Therefore, the conductive member 37 is downsized more than in a case where the support portion 55 is provided in the conductive member 37. Thus, the part to be protected from the heat source (part of the conductive member 37) can be reduced. Further, since the support portion 55 that rubs against the lower surface of the substrate is softer than the substrate, damage to the substrate due to contact between the substrate and the pin cover 38 can be suppressed or prevented. Thereby, the quality of the substrate processed by the substrate processing apparatus 1 can be further enhanced.

In the present preferred embodiment, the conductive member 37 and the pin cover 38 are different members to be combined with each other. Since the pin cover 38 is a different member from the conductive member 37, the member to be combined with the conductive member 37, the shape of the pin cover 38 is more highly freely changed than in a case where the pin cover 38 is a coating layer closely attached to the outer surface of the conductive member. Therefore, the thickness of the pin cover 38 is easily increased. Thus, heat transmitted from the heat source to the conductive member 37 can be further reduced by the pin cover 38. Thereby, an increase in the temperature of the conductive member 37 can be further suppressed.

In the present preferred embodiment, the gripping portion 41 provided in the conductive member 37 is accommodated in the pin covering portion 51 provided in the pin cover 38. At least a part of the pin covering portion 51 is disposed above the gripping portion 41 and covers the upper surface 41a of the gripping portion 41. Therefore, the pin cover 38 can protect the upper surface 41a of the gripping portion 41 from the heat source. Further, the inward opening 47 that extends inward from the gripping portion 41 to the outside of the pin covering portion 51 is defined by the pin cover 38. Thus, by causing the peripheral edge portion of the substrate to enter into the inward opening 47, the gripping portion 41 can be pressed onto the peripheral edge portion of the substrate. Therefore, the pin cover 38 can protect the gripping portion 41 from the heat source without obstructing gripping of the substrate by the gripping portion 41.

In the present preferred embodiment, the outward opening 56 that extends outward from the gripping portion 41 to the outside of the pin covering portion 51 is defined by the pin cover 38. As described above, the conductive member 37 and the pin cover 38 are different members to be combined with each other. Thus, the minute gap G1 (for example, a gap of about 2 mm or less) is generated between the inner surface of the pin covering portion 51 and the outer surface of the gripping portion 41. When the processing liquid supply device 6 supplies the processing liquid to the substrate, there is sometimes a case where a minute amount of the processing liquid enters into the gap G1. The outward opening 56 continues to the gap G1 between the inner surface of the pin covering portion 51 and the outer surface of the gripping portion 41, and is opened outward. Therefore, the processing liquid entering between the pin covering portion 51 and the gripping portion 41 is moved to the outward opening 56 and discharged outward from the outward opening 56. Thereby, a remaining amount of the processing liquid in the chuck pin 13 can be reduced, so that contamination of the substrate due to the remaining liquid can be reduced.

In the present preferred embodiment, the outward opening 56 is longer in the up and down direction than the gripping portion 41, and a sufficient opening area is secured in the outward opening 56. Therefore, the processing liquid entering into the pin cover 38 through the inward opening 47 can be efficiently discharged from the outward opening 56. Thereby, the remaining amount of the processing liquid in the chuck pin 13 can be reduced, so that the contamination of the substrate due to the remaining liquid can be reduced.

In the present preferred embodiment, the outward opening 56 is opened outward and also opened downward. The processing liquid in the outward opening 56 flows downward in the outward opening 56 by gravitational force. Therefore, in a case where a lower end of the outward opening 56 is closed, the processing liquid is accumulated in the lower end of the outward opening 56. Meanwhile, in a case where the outward opening 56 is opened downward, the processing liquid flowing down to the lower end of the outward opening 56 is discharged downward from the outward opening 56. Therefore, the remaining amount of the processing liquid in the chuck pin 13 can be reduced, so that the contamination of the substrate due to the remaining liquid can be reduced.

Although the preferred embodiments of the present invention have been described above, the present invention is not limited to the description of the above-described preferred embodiments and various modifications may be made within the scope of the present invention.

For example, the case where the support portion 55 in contact with the lower surface peripheral edge portion of the substrate is provided in the pin cover 38 is described in the above preferred embodiment. However, the support portion 55 may be provided in the conductive member 37.

The case where a part of the conductive member 37 is exposed from the pin cover 38 in a plan view is described in the above preferred embodiment. However, the pin cover 38 may cover the entire conductive member 37 in a plan view, and the entire conductive member 37 may be hidden by the pin cover 38 in a plan view.

Figure 10:
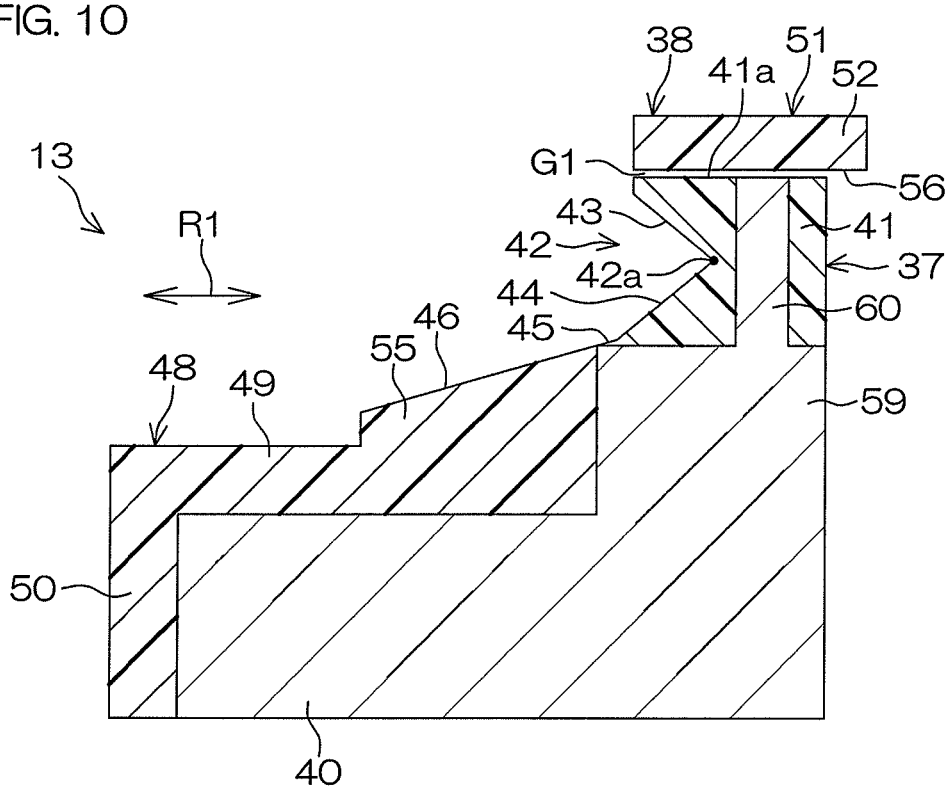
FIG. 10 is a schematic sectional view of a chuck pin according to another preferred embodiment of the present invention.

As shown in FIG. 10, the conductive member 37 may include a holding portion 59 that holds the gripping portion 41, the holding portion having higher rigidity than that of the gripping portion 41 in addition to the gripping portion 41.

As shown in FIG. 10, the gripping portion 41 and the holding portion 59 are different members. The gripping portion 41 is made of the above composite material softer than the substrate W, the composite material having chemical resistance and conductivity. The holding portion 59 is made of a material harder than the gripping portion 41, the material having chemical resistance and conductivity.

In a case where the gripping portion 41 is made of a composite material containing carbon and PFA, the holding portion 59 is made of conductive ceramics such as SiC (silicon carbide). The holding portion 59 may be a carbon sintered body or may be made of conductive ceramics other than SiC of zirconia ($ZrO_2$) or the like.

As shown in FIG. 10, the holding portion 59 includes the above base portion 40, and a core portion 60 that extends upward from the base portion 40. The gripping portion 41 is disposed above the base portion 40. The core portion 60 is inserted into an insertion hole provided in the gripping portion 41. The gripping portion 41 surrounds the entire circumference of the core portion 60. An upper end of the core portion 60 is disposed on the upper side of the bottom 42a of the accommodation groove 42. The upper end of the core portion 60 may be disposed at a height equal to the upper surface 41a of the gripping portion 41 as shown in FIG. 10, or may be disposed at a height between the upper surface 41a of the gripping portion 41 and the bottom 42a of the accommodation groove 42. When the chuck pin 13 is placed at the close position, the core portion 60 is placed in the periphery of the substrate W.

In the arrangement shown in FIG. 10, the gripping portion 41 and the holding portion 59 are provided in the conductive member 37. Both the gripping portion 41 and the holding portion 59 have conductivity. Therefore, electrification of the substrate W can be suppressed or prevented. Further, since the gripping portion 41 in contact with the substrate W is softer than the substrate W, the damage to the substrate W due to contact between the substrate W and the conductive member 37 can be suppressed or prevented. Furthermore, since the holding portion 59 that holds the gripping portion 41 has higher rigidity than that of the gripping portion 41, the rigidity of the entire conductive member 37 can be enhanced. Thereby, a deformation amount of the chuck pin 13 can be reduced. Particularly, since the gripping portion 41 is reinforced by the core portion 60 of the holding portion 59, deformation of the gripping portion 41 can be effectively suppressed.

The case where the heat source that heats at least one of the substrate and the processing liquid is the infrared heater 32 including the infrared lamp 33 is described in the above preferred embodiment. However, a resistance heater including a heating wire that generates heat by supply of electric power, or a fan that blows out hot air having a temperature higher than the room temperature may be used as the heat source.

Figure 11:
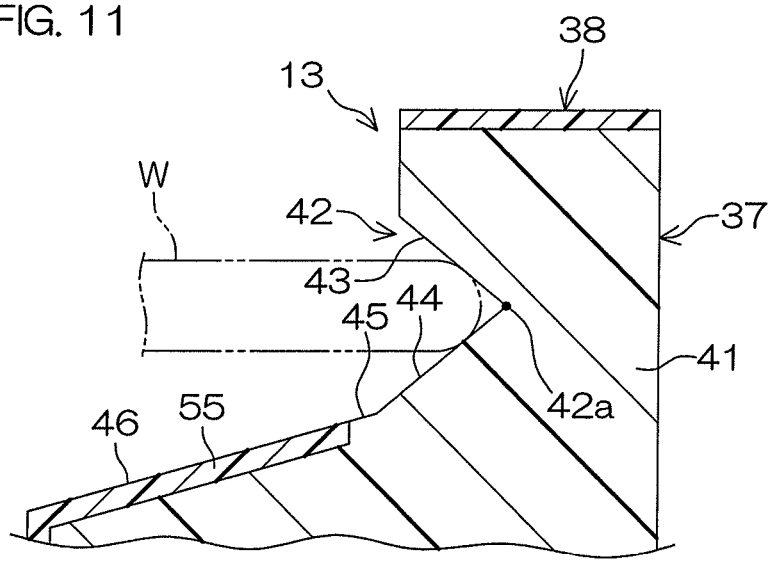
FIG. 11 is a schematic sectional view of a chuck pin according to still another preferred embodiment of the present invention.

The case where the pin cover 38 is a different member from the conductive member 37 is described in the above preferred embodiment. However, as shown in FIG. 11, all or a part of the pin cover 38 may be a coating layer closely attached to the outer surface of the conductive member. The thickness of the coating layer is more easily decreased than that of the different member from the conductive member 37. Therefore, in a case where the pin cover 38 includes the coating layer, an increase in the weight of the chuck pin 13 can be suppressed. Thereby, an increase in inertial mass of the chuck pin 13 can be suppressed.

The case where the drying step is performed in a state where the light emission of the infrared heater 32 is stopped is described in the above preferred embodiment. However, the control device 3 may cause the infrared heater 32 to heat the substrate and the liquid on the substrate in parallel with the drying step. In this case, the control device 3 may move the infrared heater 32 such that the irradiation position of the light in the upper surface of the substrate is moved in the upper surface of the substrate, or may cause the infrared heater 32 to emit the light in a state where the infrared heater 32 is immobilized. In any case, evaporation of the liquid is facilitated by heating the substrate and the liquid. Thus, a time taken for drying the substrate can be shortened.

The case where the first chemical solution nozzle 17, the second chemical solution nozzle 22, and the rinsing liquid nozzle 27 are attached to the different arms is described in the above preferred embodiment. However, two or more of the first chemical solution nozzle 17, the second chemical solution nozzle 22, and the rinsing liquid nozzle 27 may be attached to a common arm. The case where the infrared heater 32 is attached to the heater arm 35 is described in the above preferred embodiment. However, the infrared heater 32 may be attached to the arm that holds at least one of the first chemical solution nozzle 17, the second chemical solution nozzle 22, and the rinsing liquid nozzle 27.

The case where the substrate processing apparatus 1 is an apparatus that processes a disc-shaped substrate is described in the above preferred embodiment. However, the substrate processing apparatus 1 may be an apparatus that processes a polygonal substrate such as a substrate for a liquid crystal display.

Two or more of all the above preferred embodiments may be combined.

The present application corresponds to Japanese Patent Application No. 2013-101532 filed in the Japan Patent Office on May 13, 2013 and Japanese Patent Application No. 2014-011684 filed in the Japan Patent Office on Jan. 24, 2014, and the entire disclosures of these applications are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
   a spin chuck including a plurality of chuck pins disposed around a substrate, chuck opening/closing mechanisms that press the plurality of chuck pins onto a peripheral edge portion of the substrate to cause the plurality of chuck pins to grip the substrate in a horizontal posture, and a spin motor that rotates the substrate gripped by the plurality of chuck pins;
   a processing liquid supply device that supplies a processing liquid to the substrate held by the spin chuck; and
   a heat source disposed above the substrate which is held by the spin chuck, wherein
   the plurality of chuck pins includes a plurality of conductive members and a plurality of pin covers corresponding to the plurality of conductive members respectively and spaced in a circumferential directions, and
   each of the plurality of conductive members includes a gripping portion comprising a different material than the substrate for being pressable onto the peripheral edge portion of the substrate, and each of the plurality of conductive members is made of a material containing carbon, and each of the plurality of conductive members protrudes outward from an outer peripheral edge of the substrate in a plan view in a state where the gripping portion is pressed onto the peripheral edge portion of the substrate, and
   each of the plurality of the pin covers is a separate member from the plurality of conductive members, includes a pin covering portion that covers at least an upper surface of the gripping portion in a plan view, and covers, in a plan view, an entire region of a part of the conductive member protruding outward from the outer peripheral edge of the substrate in a plan view in a state where the gripping portion is pressed onto the peripheral edge portion of the substrate, and
   the chuck opening/closing mechanisms move each conductive member together with corresponding pin cover between a closed position where the gripping portion is pressed onto the peripheral edge portion of the substrate and an open position where the gripping portion is separated from the peripheral edge portion of the substrate.

2. The substrate processing apparatus according to claim 1, wherein
   the heat source includes a lamp that emits light toward the substrate gripped by the spin chuck from an upper side of the substrate, and
   each pin cover has a surface texture/roughness causing each pin cover to have an increased reflectivity.

3. The substrate processing apparatus according to claim 2, wherein
   each pin cover includes a white outer surface.

4. The substrate processing apparatus according to claim 1, wherein
   each of the pin covers includes a support portion that extends obliquely downward from the gripping portion and supports a lower surface peripheral edge portion of the substrate in a state where the gripping portion is separated from the peripheral edge portion of the substrate, and comprises a different material than the substrate.

5. The substrate processing apparatus according to claim 1, wherein
the pin covering portion accommodates the gripping portion to cover at least the upper surface of the gripping portion in a plan view, and each pin cover defines an inward opening that extends inward from the gripping portion to an outside of the pin covering portion.

6. The substrate processing apparatus according to claim 5, wherein
each pin cover defines an outward opening that extends outward from the gripping portion to the outside of the pin covering portion and continues to a gap between an inner surface of the pin covering portion and an outer surface of the gripping portion.

7. The substrate processing apparatus according to claim 6, wherein
the outward opening is longer in an up and down direction than the gripping portion.

8. The substrate processing apparatus according to claim 6, wherein
the outward opening is open outward and also open downward.

9. The substrate processing apparatus according to claim 1, further comprising:
a control device that controls the spin chuck, the processing liquid supply device, and the heat source, wherein
the control device executes:
a liquid film forming step of causing the processing liquid supply device to supply the processing liquid to the substrate to form a liquid film of the processing liquid covering an entire upper surface of the substrate; and
a heating step of causing the heat source to generate heat in a state where the liquid film of the processing liquid formed in the liquid film forming step is placed on the substrate.

10. The substrate processing apparatus according to claim 1, further comprising:
a control device that controls the spin chuck, the processing liquid supply device, and the heat source, wherein
the control device executes:
a processing liquid supplying step of causing the processing liquid supply device to supply the processing liquid to the substrate while causing the spin chuck to rotate the substrate;
a drying step of removing the processing liquid from the substrate by causing the spin chuck to rotate the substrate at a higher rotation speed than a rotation speed in the processing liquid supplying step in a state where supply of the processing liquid to the substrate is stopped, to dry the substrate; and
a heating step of causing the heat source to generate heat in parallel with the drying step.

11. The substrate processing apparatus according to claim 1, wherein
each conductive member includes said gripping portion comprising said different material than the substrate for being pressable onto the peripheral edge portion of the substrate, and further includes a holding portion that comprises a different material than the gripping portion, and holds the gripping portion.

\* \* \* \* \*